United States Patent
Xu et al.

(10) Patent No.: US 8,691,698 B2
(45) Date of Patent: Apr. 8, 2014

(54) CONTROLLED GAS MIXING FOR SMOOTH SIDEWALL RAPID ALTERNATING ETCH PROCESS

(75) Inventors: Qing Xu, Fremont, CA (US); William Thie, Fremont, CA (US); Camelia Rusu, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 45 days.

(21) Appl. No.: 13/369,125

(22) Filed: Feb. 8, 2012

(65) Prior Publication Data

US 2013/0203256 A1  Aug. 8, 2013

(51) Int. Cl.
*H01L 21/311* (2006.01)
(52) U.S. Cl.
USPC ........... 438/696; 438/694; 438/695; 438/700; 438/702; 438/703; 438/710; 438/719; 216/37; 216/67; 216/79
(58) Field of Classification Search
None
See application file for complete search history.

(56) References Cited

U.S. PATENT DOCUMENTS

| 6,071,822 | A | 6/2000 | Donohue et al. | |
|---|---|---|---|---|
| 6,921,723 | B1 | 7/2005 | Lee et al. | |
| 6,924,235 | B2 | 8/2005 | Johnson et al. | |
| 7,288,482 | B2 | 10/2007 | Panda et al. | |
| 2005/0287815 | A1* | 12/2005 | Lai et al. | 438/710 |
| 2007/0004215 | A1* | 1/2007 | Mrvos et al. | 438/712 |
| 2010/0003827 | A1* | 1/2010 | Kessels et al. | 438/719 |
| 2011/0244686 | A1 | 10/2011 | Aso et al. | |

* cited by examiner

*Primary Examiner* — Lan Vinh
*Assistant Examiner* — Jiong-Ping Lu
(74) *Attorney, Agent, or Firm* — Beyer Law Group LLP (57) ABSTRACT

A method for etching features in a silicon layer disposed below a mask in a plasma processing chamber a plurality of cycles is provided. A deposition phase forming a deposition on the silicon layer in the plasma processing chamber is provided comprising providing a deposition gas into the plasma processing chamber wherein the deposition gas comprises a halogen containing etchant component and a fluorocarbon deposition component, forming the deposition gas into a plasma, which provides a net deposition on the silicon layer, and stopping the flow of the deposition gas. A silicon etch phase is provided, comprising providing a silicon etch gas into the plasma processing chamber that is different than the deposition gas, forming the silicon etch gas into a plasma to etch the silicon layer, and stopping the flow of the silicon etch gas.

19 Claims, 8 Drawing Sheets

CONTROLLED GAS MIXING FOR SMOOTH SIDEWALL RAPID ALTERNATING ETCH PROCESS

BACKGROUND OF THE INVENTION

1. Field of the Invention

The invention relates to a method of obtaining a structure on a semiconductor wafer by etching an etch layer. More specifically, the invention relates to etching silicon in forming a semiconductor device.

2. Description of the Related Art

In forming semiconductor devices on a substrate, an etch layer is etched. The etch layer may be part of the substrate or a layer above the substrate. The etching may occur in a plasma processing chamber.

SUMMARY OF THE INVENTION

To achieve the foregoing and in accordance with the purpose of the present invention, a method for etching features in a silicon layer disposed below a mask in a plasma processing chamber a plurality of cycles is provided. A deposition phase forming a deposition on the silicon layer in the plasma processing chamber is provided comprising providing a deposition gas into the plasma processing chamber wherein the deposition gas comprises a halogen containing etchant component and a fluorocarbon deposition component, forming the deposition gas into a plasma, which provides a net deposition on the silicon layer, and stopping the flow of the deposition gas. A silicon etch phase is provided, comprising providing a silicon etch gas into the plasma processing chamber that is different than the deposition gas, forming the silicon etch gas into a plasma to etch the silicon layer, and stopping the flow of the silicon etch gas.

In another manifestation of the invention a method for etching features in a silicon layer disposed below a mask in a plasma processing chamber, comprising a plurality of cycles is provided. A deposition phase forming a deposition on the silicon layer in the plasma processing chamber is provided for each cycle, comprising providing a deposition gas into the plasma processing chamber wherein the deposition gas comprises at least one of $SF_6$, $CF_4$, or $NF_3$ and at least one of $C_4F_8$, or $C_4F_6$, providing a bias of 50 to 300 volts, forming the deposition gas into a plasma, which provides a net deposition on the silicon layer, and stopping the flow of the deposition gas. A silicon etch phase is provided for each cycle, comprising providing a silicon etch gas into the plasma processing chamber that is different than the deposition gas, providing a bias of 50 to 200 volts, forming the silicon etch gas into a plasma to etch the silicon layer, and stopping the flow of the silicon etch gas.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
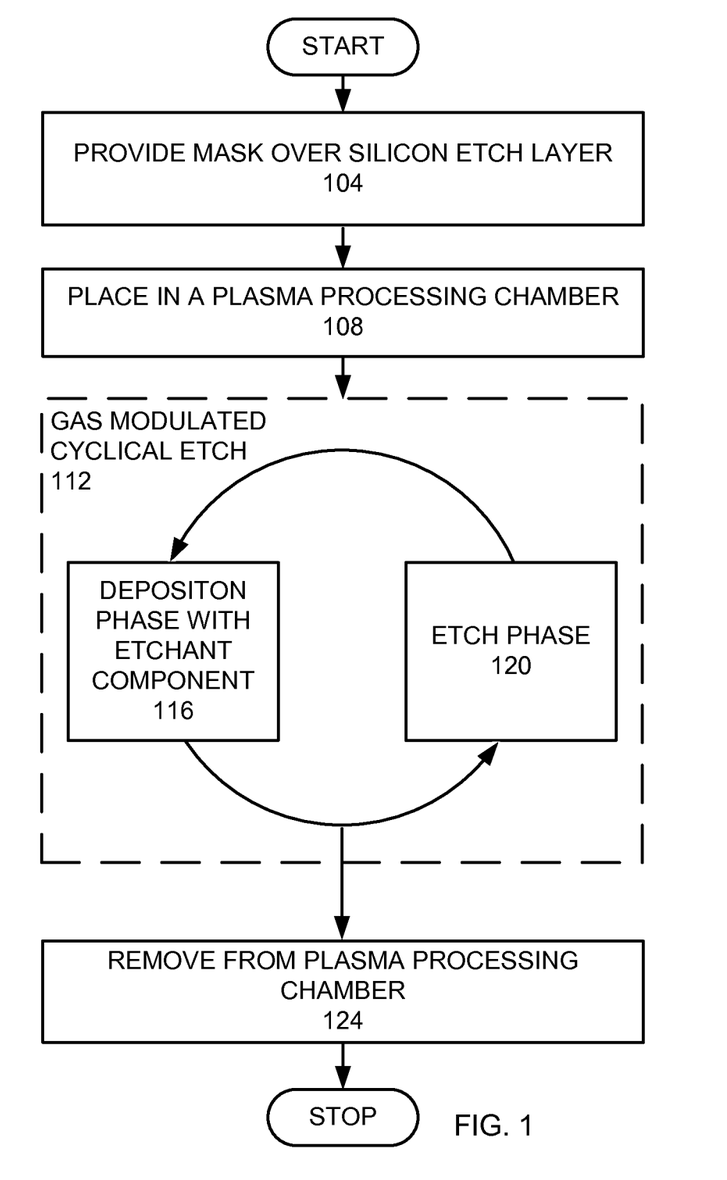
FIG. 1 is a flow chart of an embodiment of the invention.

FIG. 1 is a high level flow chart of an embodiment of the invention. In this embodiment, a patterned mask is formed over a silicon etch layer on a substrate (step 104). The silicon etch layer may be part of the substrate, such as a silicon layer of a silicon wafer or may be a layer over the substrate, such as polysilicon layer over the substrate. The substrate is placed in a plasma processing chamber (step 108). The silicon etch layer is subjected to a gas modulated cyclical etch (step 112). The gas modulated cyclical etch comprises a plurality of cycles, where each cycle comprises a deposition phase with an etchant component (step 116) and an etch phase (step 120). The wafer is then removed from the plasma processing chamber (step 124).

Example

Figure 2A:
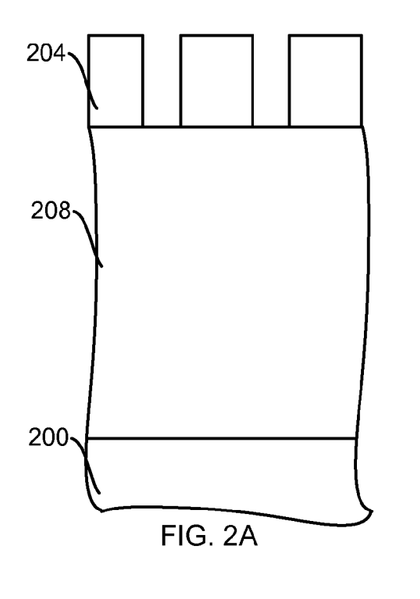
FIGS. 2A-E are schematic views of the formation of a feature using the inventive process.

In a preferred embodiment of the invention, the mask is a photoresist mask patterned over a silicon layer on a substrate (step 104). FIG. 2A is a schematic cross-sectional view of a silicon layer 208, over a substrate 200, over which a patterned organic mask 204 has been formed. One or more intermediate patterning layers, such as an antireflective coating (ARC), may be disposed between the silicon layer 208 and the patterned organic mask 204 to improve the mask patterning process.

Figure 3:
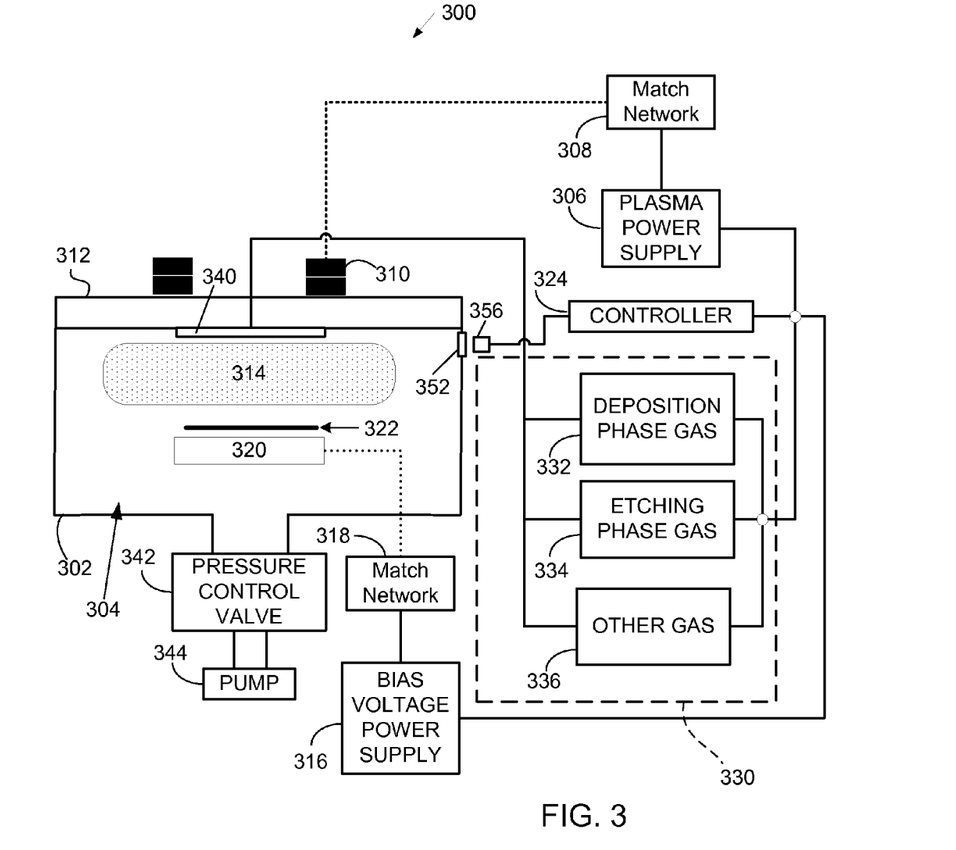
FIG. 3 is a schematic view of a plasma processing chamber that may be used in an embodiment of the invention.

The substrate is placed in a processing tool (step 108). FIG. 3 schematically illustrates an example of a plasma processing system 300 which may be used to perform the process of etching a silicon layer in accordance with one embodiment of the present invention. The plasma processing system 300 includes a plasma reactor 302 having a plasma processing chamber 304 therein. A plasma power supply 306, tuned by a match network 308, supplies power to a TCP coil 310 located near a power window 312 to create a plasma 314 in the plasma processing chamber 304. The TCP coil (upper power source) 310 may be configured to produce a uniform diffusion profile within processing chamber 304. For example, the TCP coil 310 may be configured to generate a toroidal power distribution in the plasma 314. The power window 312 is provided to separate the TCP coil 310 from the plasma chamber 304 while allowing energy to pass from the TCP coil 310 to the plasma chamber 304. A wafer bias voltage power supply 316 tuned by a match network 318 provides power to an electrode 320 to set the bias voltage on a wafer 322 which is supported by the electrode 320. A controller 324 sets points for the plasma power supply 306 and the wafer bias voltage supply 316.

The plasma power supply 306 and the wafer bias voltage power supply 316 may be configured to operate at specific radio frequencies such as, for example, 13.56 MHz, 27 MHz, 2 MHz, 400 kHz, or combinations thereof. Plasma power supply 306 and wafer bias power supply 316 may be appropriately sized to supply a range of powers in order to achieve desired process performance. For example, in one embodiment of the present invention, the plasma power supply 306 may supply the power in a range of 300 to 10000 Watts, and the wafer bias voltage power supply 316 may supply a bias voltage of in a range of 10 to 1000 V. In addition, the TCP coil 310 and/or the electrode 320 may be comprised of two or more sub-coils or sub-electrodes, which may be powered by a single power supply or powered by multiple power supplies.

As shown in FIG. 3, the plasma processing system 300 further includes a gas source/gas supply mechanism 330. The gas source includes a deposition phase gas source 332, an etching phase gas source 334, and optionally, an additional gas source 336. The gas sources 332, 334, and 336 are in fluid connection with processing chamber 304 through a gas inlet, such as a shower head 340. The gas inlet may be located in any advantageous location in chamber 304, and may take any form for injecting gas. Preferably, however, the gas inlet may be configured to produce a "tunable" gas injection profile, which allows independent adjustment of the respective flow of the gases to multiple zones in the process chamber 304. The process gases and byproducts are removed from the chamber 304 via a pressure control valve 342 and a pump 344, which also serve to maintain a particular pressure within the plasma processing chamber 304. The gas source/gas supply mechanism 330 is controlled by the controller 324. A 2300 Syndion by Lam Research Corp. may be used to practice an embodiment of the invention. To this device, and optical window 352 is added. An optical spectrometer 356 is positioned to measure light from the plasma that passes through the optical window 352. Output from the optical spectrometer 356 is provided to the controller 324.

Figure 4:
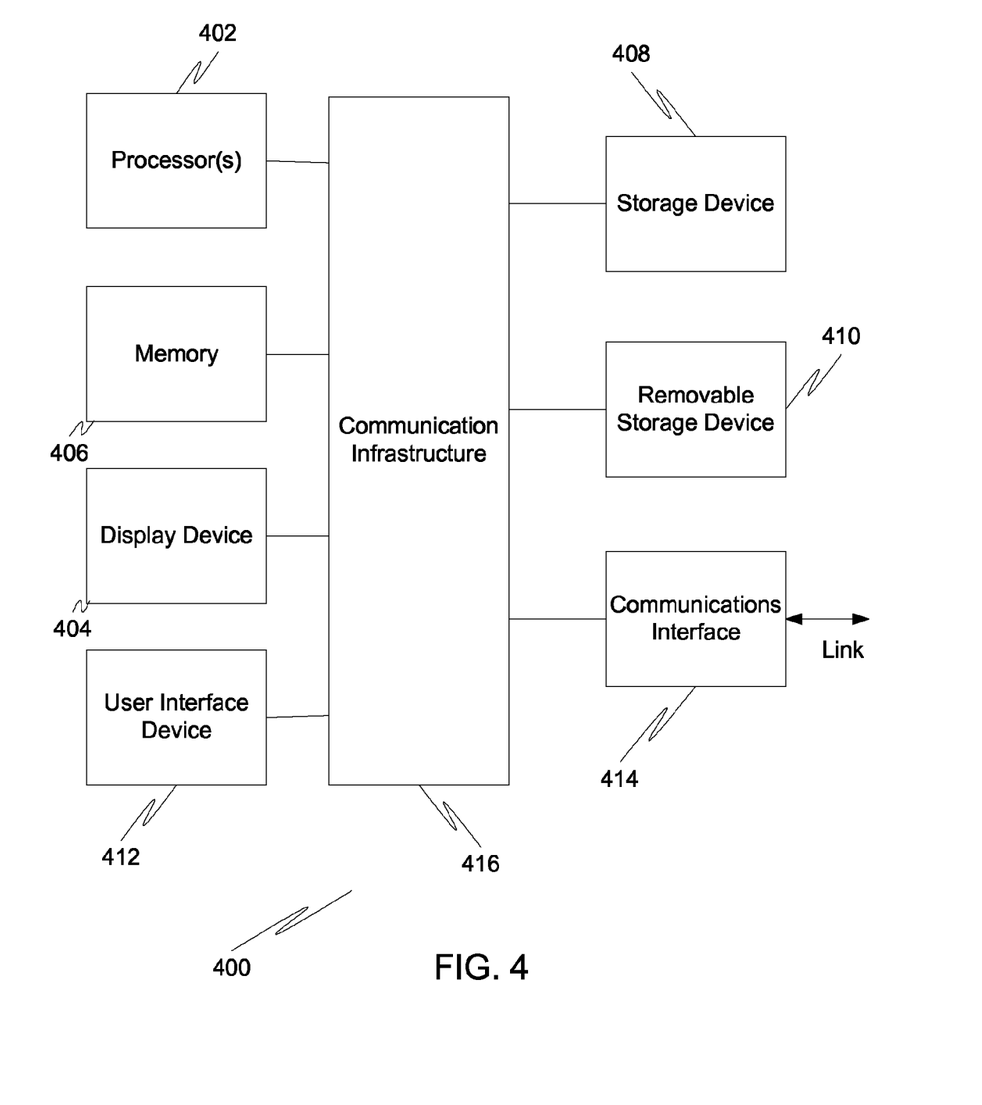
FIG. 4 is a schematic view of a computer system that may be used in practicing the invention.

FIG. 4 is a high level block diagram showing a computer system 400, which is suitable for implementing a controller 324 used in embodiments of the present invention. The computer system may have many physical forms ranging from an integrated circuit, a printed circuit board, and a small handheld device up to a huge super computer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2B:
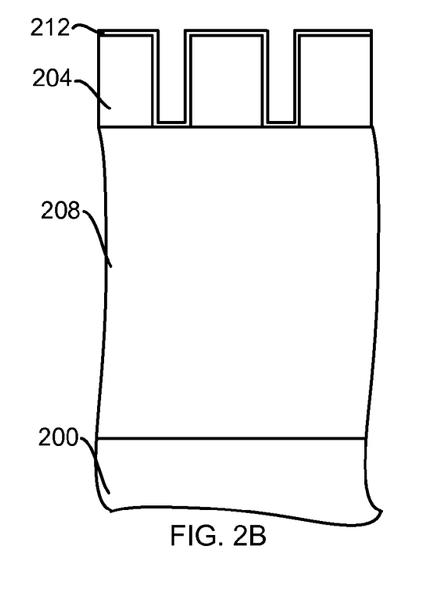
Figure 5:
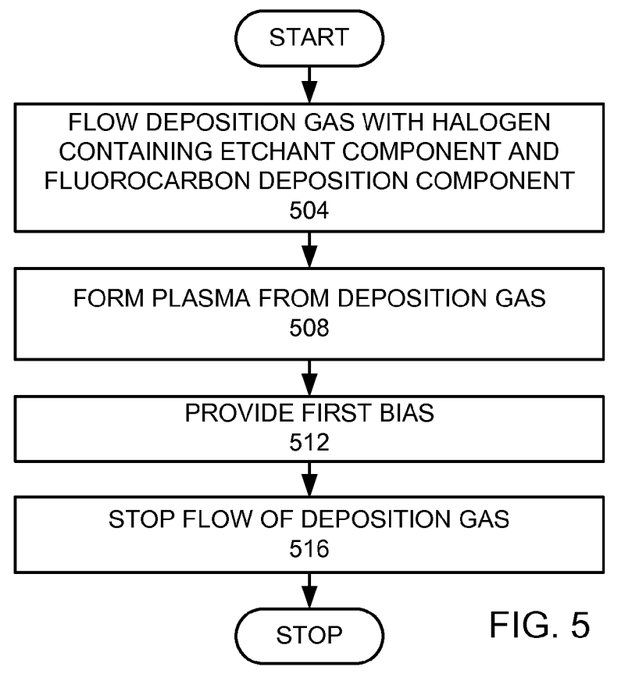
FIG. 5 is a more detailed flow chart of the deposition phase.

The etch layer is subjected to a gas modulated cyclical etch (step 112). The gas modulated cyclical etch comprises a plurality of cycles, where each cycle comprises a deposition phase with an etchant gas component (step 116) and an etch phase (step 120). FIG. 5 is a more detailed flow chart of the deposition phase. A deposition gas comprising a halogen containing etchant component and a fluorocarbon deposition component is flowed into the plasma processing chamber 304 (step 504). The deposition gas is formed into a plasma (step 508). A first bias is provided (step 512). A net deposition of a passivation layer is provided by the deposition plasma. Preferably, silicon is not etched by the plasma. The flow of the deposition gas is stopped (step 516). FIG. 2B is a cross-sectional view of the silicon etch layer 208 and mask 204 after a deposition layer 212 has been formed during the deposition phase (step 116).

An example of a deposition recipe provides a flow of 200 sccm $C_4F_8$ and 20 sccm $SF_6$ to the plasma process chamber. A pressure of 30 mTorr, a bias of 100 volts, and 2300 watts of RF power at 13.56 MHz are provided to the plasma.

Figure 2C:
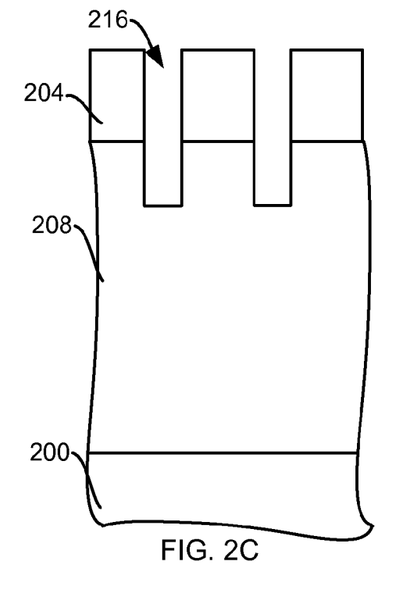
Figure 6:
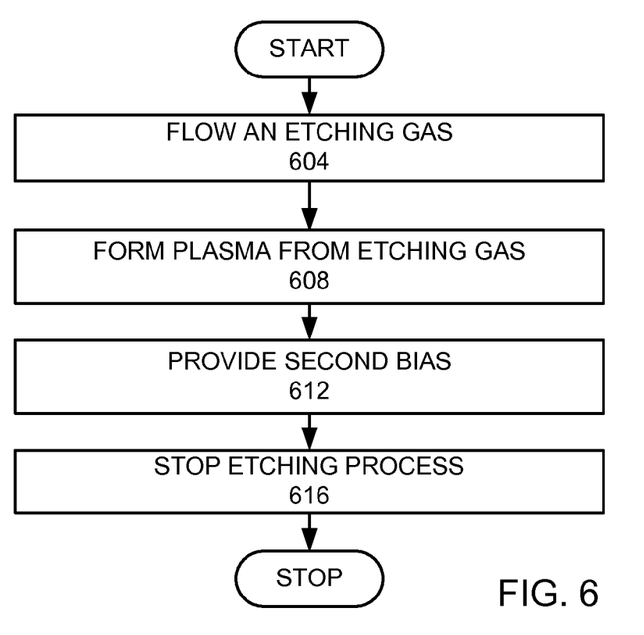
FIG. 6 is a more detailed flow chart of the etch phase.

FIG. 6 is a more detailed flow chart of the etch phase (step 120). An etch gas is flowed into the plasma processing chamber 304 (step 604). The etch gas is formed into a plasma (step 608). A second bias is provided (step 612). The etch phase provides a net removal of the deposition layer and an etch of the silicon etch layer. The flow of the etch gas is stopped (step 616). FIG. 2C is a cross-sectional view of the silicon etch layer 208 and mask 204 after an etch phase (step 120), which forms part of the etch feature 216.

An example of an etch recipe provides a flow of 150 sccm $SF_6$ to the plasma process chamber. A pressure of 120 mTorr, a bias of 100 volts, and 2300 Watts of RF power are provided to the plasma processing chamber.

Figure 2D:
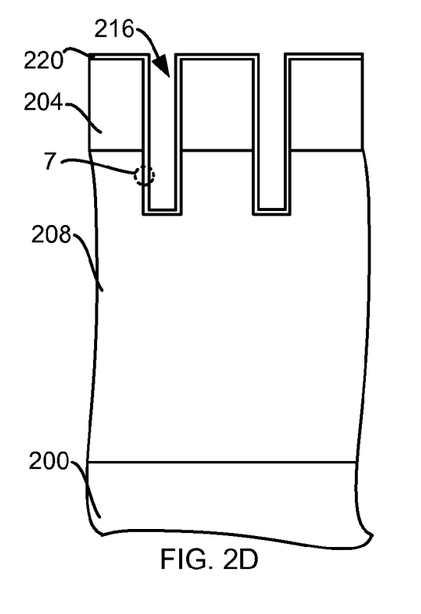

The deposition phase and etch phase are cyclically repeated. FIG. 2D is a cross-sectional view of the silicon etch layer 208 and mask 204 after another deposition layer 220 has been formed.

Figure 2E:
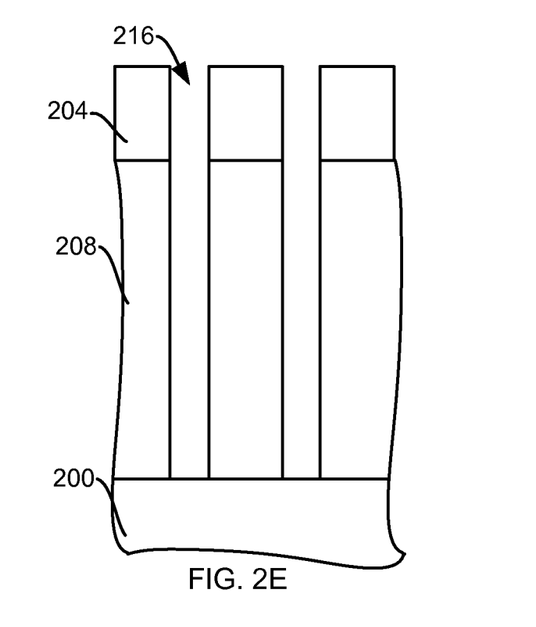

FIG. 2E is a cross-sectional view of the silicon etch layer 208 and mask 204 after a plurality of cycles of the deposition phase and the etch phase, where the etch feature 216 is completely etched. In one embodiment, the plurality of cycles is between 100 to 600 cycles depending on feature size and depth.

Figure 7:
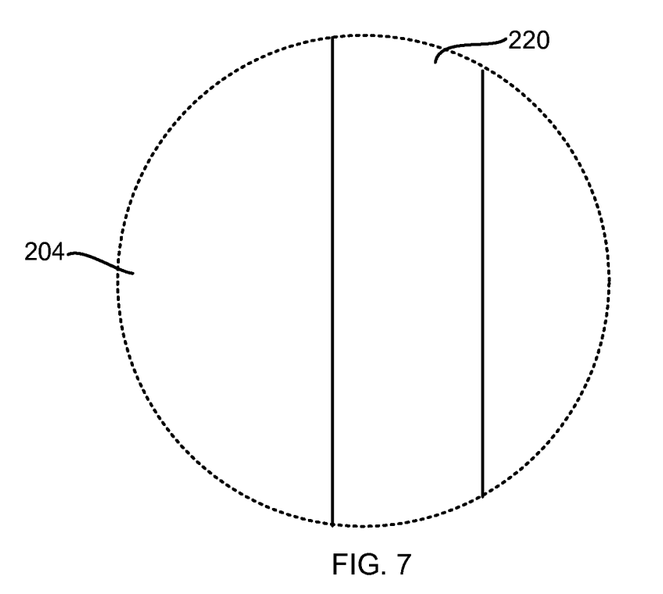
FIG. 7 is an enlarged view of the section 7 shown in FIG. 2D.

FIG. 7 is an enlarged view of the section 7 shown in FIG. 2D, which shows an enlarged view of part of the deposition layer 220 and the silicon etch layer 208. The enlarged view shows how the deposition layer 220 is uniform without gaps, which uniformly protects the sidewalls of the silicon etch layer 208, to prevent or reduce striation.

Figure 8A:
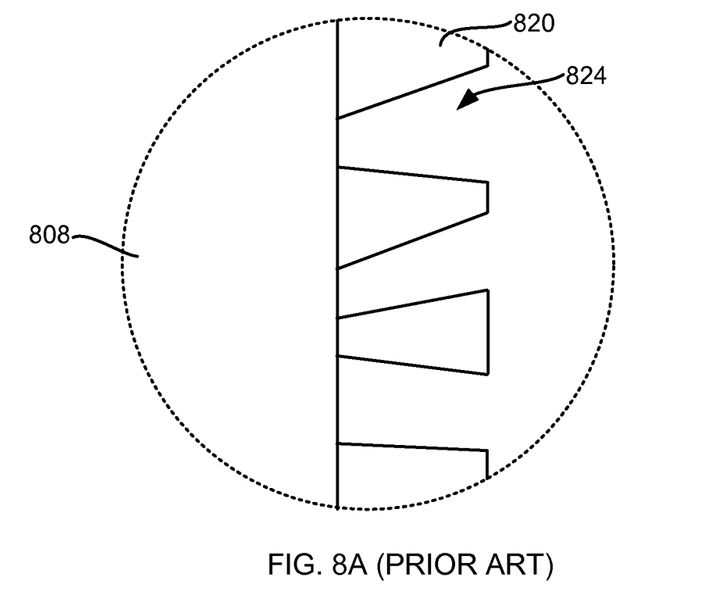
FIG. 8A is an enlarged view of a deposition layer and underlying silicon sidewall in a prior art process.
Figure 9A:
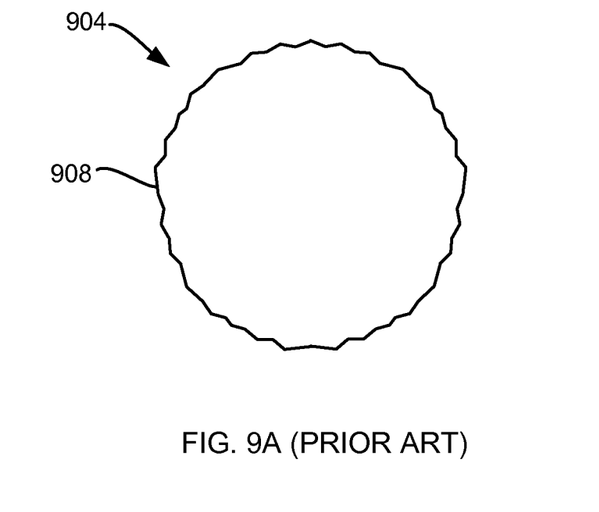
FIG. 9A is exaggerated-scale sketch of cross sectional view of a feature formed by a prior art process.

FIG. 8A is an enlarged view of a deposition layer 820 and silicon etch layer 808 in a prior art process, where a halogen containing etchant is not provided in the deposition gas. The deposition layer 820 has gaps 824 or is not dense, smooth and conformal enough to sufficiently protect the sidewalls of the silicon etch layer 808. FIG. 9A is a cross sectional view of a completed feature 904 etched with a prior art process. Such prior art processes may require a high bias during an etch phase to preferentially remove polymer at bottoms of features with respect to sidewalls. Such high biases and/or such lack of sufficient sidewall protection cause striations 908 indicated by the rough edge.

Figure 8B:
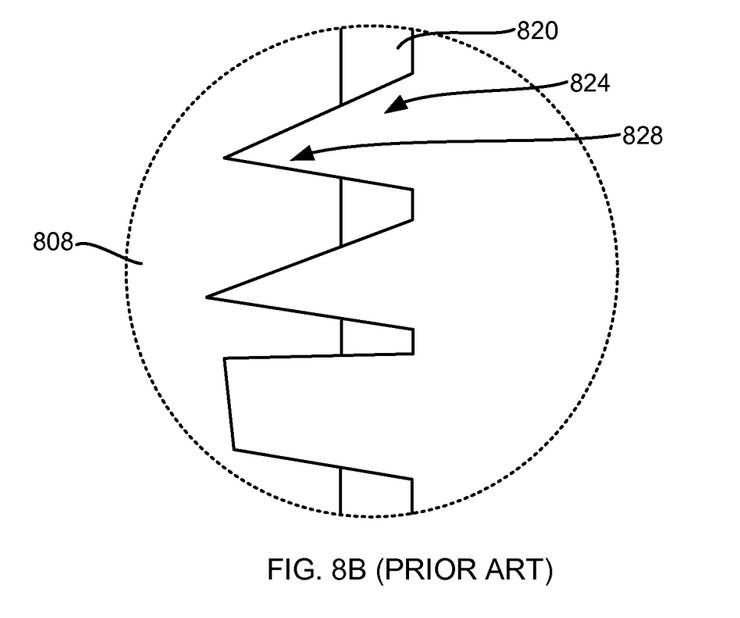
FIG. 8B is an enlarged view of the deposition layer and underlying silicon sidewall during an etch phase after some of the deposition layer has been etched away during the further etching of the features.
Figure 9B:
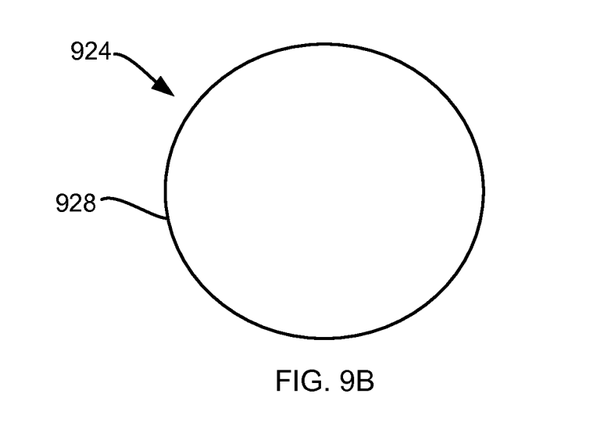
FIG. 9B is cross sectional view of a feature formed by an embodiment of the invention.

FIG. 8B is an enlarged view of the deposition layer 820 and silicon etch layer 808 during an etch phase after some of the deposition layer 820 has been etched away during the further etching of the features. Because there are gaps 824 in the deposition layer 820 parts of the sidewall of the silicon etch layer 808 are etched away forming sidewall defects and striations 828. FIG. 9B is a cross sectional view of a completed feature 924 etched using an embodiment of the invention. Because the invention provides a halogen containing component during the deposition phase better sidewall protection is provided and a lower bias is needed during the deposition and etching because the halogen reduces the deposition on the bottoms of the features. The better sidewall protection and low bias prevents striation and provides a smooth sidewall 928.

In other possible scenarios, other mechanisms such as not having a sufficiently dense deposition layer cause striations. In such cases, embodiments of the invention provide a denser and smooth deposition layer, so as to reduce or prevent striation.

The invention also found that using a halogen containing etchant in the deposition gas enables lower bias to be used for both deposition and etch steps. The anisotropic clearing of the bottom polymer is enhanced by the halogen etchant in the deposition gas, and thus requiring less bias for ions. This results in a much more smooth bottom polymer edge, than prior art high bias process, thus reducing or eliminating sidewall striations.

Without being limited by theory, it is believed that a halogen etchant in addition to a fluorocarbon deposition component provides an improved process, by adding additional free fluorine radicals than what is provided by just the fluorocarbon deposition component.

Control of the ratio of the halogen containing etchant to the fluorocarbon deposition component provides control of the deposition rate of the polymer. In an embodiment of the invention the ratio of the halogen containing enchant to fluorocarbon deposition component ranges from 1:20 to 1:8.

Embodiments of the invention provide an improved etch for both small CD features and large CD features. In addition, embodiments of the invention provides improved etch for both low and high aspect ratios. The mask may be a photoresist mask or a hard mask.

The higher bias during the etch phase allows for complete removal of the deposition layer during the etch phase. The lower bias during the deposition phase has been found to reduce wafer damage and reduce striation. The addition of the halogen containing etchant component was unexpectedly found to allow a lower deposition bias.

In other embodiments the deposition bias may be between 50 to 300 volts. More preferably the deposition bias is between 100 to 150 volts. In other embodiments the etch bias may be between 50 to 200 volts.

While this invention has been described in terms of several preferred embodiments, there are alterations, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. A method for etching features in a silicon layer disposed below a mask in a plasma processing chamber, comprising a plurality of cycles, wherein each cycle comprises:
   providing a deposition phase forming a deposition on the silicon layer in the plasma processing chamber, comprising;
   providing a deposition gas into the plasma processing chamber wherein the deposition gas comprises a halogen containing etchant component and a fluorocarbon deposition component;
   forming the deposition gas into a plasma, which provides a net deposition on the silicon layer; and
   stopping the flow of the deposition gas; and
   providing a silicon etch phase, comprising;
   providing a silicon etch gas into the plasma processing chamber that is different than the deposition gas;
   forming the silicon etch gas into a plasma to etch the silicon layer; and
   stopping the flow of the silicon etch gas.

2. The method, as recited in claim 1, wherein the providing the deposition phase further comprises providing a bias of 50 to 300 volts.

3. The method, as recited in 2, wherein the halogen of the halogen containing etchant component comprises at least one of fluorine, bromine, or chlorine.

4. The method, as recited in claim 3, wherein the halogen containing etchant is at least one of $SF_6$, $CF_4$, or $NF_3$.

5. The method, as recited in claim 4, wherein the fluorocarbon deposition component comprise at least one of $C_4F_8$, or $C_4F_6$.

6. The method, as recited in claim 5, wherein the providing the etching phase further comprises providing a bias of 50 to 200 volts.

7. The method, as recited in claim 6, wherein the deposition phase bias is between 100 to 150 volts.

8. The method, as recited in claim 7, wherein the silicon etch phase provides a net removal of the deposition layer.

9. The method, as recited in claim 8, wherein a ratio of the halogen containing enchant to fluorocarbon deposition component ranges from 1:20 to 1:8.

10. The method, as recited in claim 9, wherein the plurality of cycles is between 100 to 600 cycles.

11. The method, as recited in 1, wherein the halogen of the halogen containing etchant component comprises at least one of fluorine, bromine, or chlorine.

12. The method, as recited in claim 1, wherein the halogen containing etchant is at least one of $SF_6$ or $NF_3$.

13. The method, as recited in claim 12, wherein the fluorocarbon deposition component comprise at least one of $C_4F_8$, or $C_4F_6$.

14. The method, as recited in claim 1, wherein the providing the etching phase further comprises providing a bias of 50 to 200 volts.

15. The method, as recited in claim 14, wherein the deposition phase bias is between 100 to 150 volts.

16. The method, as recited in claim 1, wherein the silicon etch phase provides a net removal of the deposition layer.

17. The method, as recited in claim 1, wherein a ratio of the halogen containing enchant to fluorocarbon deposition component ranges from 1:20 to 1:8.

18. The method, as recited in claim 1, wherein the plurality of cycles is between 100 to 600 cycles.

19. A method for etching features in a silicon layer disposed below a mask in a plasma processing chamber, comprising a plurality of cycles, wherein each cycle comprises:

providing a deposition phase forming a deposition on the silicon layer in the plasma processing chamber, comprising;
  providing a deposition gas into the plasma processing chamber wherein the deposition gas comprises at least one of $SF_6$, $CF_4$, or $NF_3$ and at least one of $C_4F_8$, or $C_4F_6$;
  providing a bias of 50 to 300 volts;
  forming the deposition gas into a plasma, which provides a net deposition on the silicon layer; and
  stopping the flow of the deposition gas; and
providing a silicon etch phase, comprising;
  providing a silicon etch gas into the plasma processing chamber that is different than the deposition gas;
  providing a bias of 50 to 200 volts;
  forming the silicon etch gas into a plasma to etch the silicon layer; and
  stopping the flow of the silicon etch gas.

* * * * *